US009995895B2

(12) United States Patent
Hofrichter

(10) Patent No.: US 9,995,895 B2
(45) Date of Patent: Jun. 12, 2018

(54) PHOTONIC CIRCUIT DEVICE WITH ON-CHIP OPTICAL GAIN MEASUREMENT STRUCTURES

(71) Applicant: INTERNATIONAL BUSINESS MACHINES CORPORATION, Armonk, NY (US)

(72) Inventor: Jens Hofrichter, Gattikon (CH)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 100 days.

(21) Appl. No.: 15/032,909

(22) PCT Filed: Oct. 7, 2014

(86) PCT No.: PCT/IB2014/065105
§ 371 (c)(1),
(2) Date: Apr. 28, 2016

(87) PCT Pub. No.: WO2015/063628
PCT Pub. Date: May 7, 2015

(65) Prior Publication Data

US 2016/0252692 A1 Sep. 1, 2016

(30) Foreign Application Priority Data

Oct. 31, 2013 (GB) .................................. 1319207.5

(51) Int. Cl.
*G02B 6/00* (2006.01)
*G02B 6/42* (2006.01)
(Continued)

(52) U.S. Cl.
CPC .............. *G02B 6/4286* (2013.01); *G01J 1/44* (2013.01); *G02B 6/12004* (2013.01);
(Continued)

(58) Field of Classification Search
CPC ........... G02B 6/30; G02B 6/305; H01S 5/146; H01S 5/32
(Continued)

(56) References Cited

U.S. PATENT DOCUMENTS

| | | | | |
|---|---|---|---|---|
| 7,853,103 | B2 | 12/2010 | Blauvelt et al. | |
| 9,625,651 | B2 * | 4/2017 | Kumar .................. | G02B 6/305 |

(Continued)

FOREIGN PATENT DOCUMENTS

| | | | |
|---|---|---|---|
| EP | 2544319 | A1 | 1/2013 |
| WO | 2009126351 | A2 | 10/2009 |
| WO | 2012134632 | A2 | 10/2012 |

OTHER PUBLICATIONS

Jansen et al., "Gain-Switched Laser-Amplifier Photonic Integrated Circuit Generating 590MW Peak Power Optical Pulses," Electronics Letters, Sep. 12, 1991, p. 1778-1779, vol. 27 No. 19.

(Continued)

*Primary Examiner* — Kevin Pyo
(74) *Attorney, Agent, or Firm* — Rabin Bhattacharya

(57) ABSTRACT

The present invention is directed to a photonic circuit device for optical gain measurement, including: a substrate with a photonic circuit; an active gain section; at least two light couplers arranged such that at least a part of the active gain section is between the light couplers; and a partial reflector arranged to reflect light propagating along the same direction back to a center of the gain section, and wherein the device does not include any other reflector opposite to the partial reflector with respect to the active gain section and configured to reflect light back to the center of the gain section. The present invention is further directed to related gain measurement methods.

15 Claims, 8 Drawing Sheets

(51) Int. Cl.

| | |
|---|---|
| ***H01S 5/00*** | (2006.01) |
| ***H01S 5/026*** | (2006.01) |
| ***H01S 5/10*** | (2006.01) |
| ***H01S 5/50*** | (2006.01) |
| ***G01J 1/44*** | (2006.01) |
| ***G02B 6/12*** | (2006.01) |
| ***G02B 6/122*** | (2006.01) |
| ***G02B 6/34*** | (2006.01) |
| ***H01S 3/091*** | (2006.01) |
| ***H01S 3/10*** | (2006.01) |
| ***H01S 5/04*** | (2006.01) |
| ***H01S 5/042*** | (2006.01) |
| ***H01S 5/0683*** | (2006.01) |
| ***H01S 5/30*** | (2006.01) |
| ***H01S 5/343*** | (2006.01) |
| *G01J 1/42* | (2006.01) |

(52) U.S. Cl.

CPC ............. *G02B 6/1228* (2013.01); *G02B 6/34* (2013.01); *G02B 6/428* (2013.01); *G02B 6/4214* (2013.01); *H01S 3/091* (2013.01); *H01S 3/10015* (2013.01); *H01S 5/005* (2013.01); *H01S 5/0014* (2013.01); *H01S 5/026* (2013.01); *H01S 5/041* (2013.01); *H01S 5/042* (2013.01); *H01S 5/0683* (2013.01); *H01S 5/1032* (2013.01); *H01S 5/3013* (2013.01); *H01S 5/343* (2013.01); *H01S 5/50* (2013.01); *G01J 2001/4247* (2013.01)

(58) Field of Classification Search

USPC ....... 250/227.24, 227.28; 385/14, 28, 39, 43

See application file for complete search history.

(56) References Cited

U.S. PATENT DOCUMENTS

| | | | | |
|---|---|---|---|---|
| 9,658,401 | B2 * | 5/2017 | Li ............................ | G02B 6/14 |
| 2012/0250007 | A1 | 10/2012 | Na et al. | |

OTHER PUBLICATIONS

Hyundai Park et al., "Device and Integration Technology for Silicon Photonic Transmitters," IEEE Journal of Selected Topics in Quantum Electronics, Jun. 6, 2011, p. 674, vol. 17 No. 3.

Ml Ma et al., "Measurement of Gain Characteristics of Semiconductor lasers by amplified spontaneous emissions from dual facets," Optics Express, Apr. 19, 2013, p. 10335, vol. 21 No. 8.

* cited by examiner

PHOTONIC CIRCUIT DEVICE WITH ON-CHIP OPTICAL GAIN MEASUREMENT STRUCTURES

CROSS-REFERENCE TO RELATED APPLICATION

This application claims priority under 35 U.S.C. § 371 from PCT Application PCT/IB2014/065105, filed on Oct. 7, 2014, which claims priority from United Kingdom Patent Application No. 1319207.5 filed Oct. 31, 2013. The entire contents of both applications are incorporated herein by reference.

FIELD OF THE INVENTION

The invention relates in general to the field of photonic circuit devices and, in particular, to optical gain measurement.

BACKGROUND

Silicon photonics relate to photonic systems, where silicon is used as medium for light propagation because of the material's low loss. Silicon photonics makes use of well-established silicon manufacturing principles exploited in complementary metal-oxide semiconductor (CMOS) electronics. The features are usually patterned into micro-photonic components with sub-micron precision (to operate in the infrared). Silicon on insulator (SOI) is typically used as a material of choice. The fabrication of silicon photonic devices can otherwise involve known semiconductor fabrication techniques; since silicon is already used as a substrate of choice for most integrated circuits, it is possible to create hybrid devices in which the optical and electronic components are integrated onto a single chip.

To meet the requirements of future computing systems, high speed and energy efficient alternatives to on-chip electrical interconnects are needed. Integrated optics, in particular silicon photonics, meet such requirements. Integrated optical interconnects with compatible light sources are needed for mass-fabrication of low-cost, high-performance CMOS-based chips. Due to the indirect band gap of silicon, no Si-based light source is available. Efficient light sources are typically based on III-V semiconductors which are heterogeneously or hybrid integrated on a Si photonics platform.

The most promising approaches to date resort to bonding a full epitaxial III-V-based gain layer stack, or a thin seed layer, which can be subject to successive re-growth, on top of the silicon photonic waveguides. In either case, to measure, characterize and evaluate the laser structures or light sources, special test structures are needed in order to obtain insight into key device parameters. One of the key parameter is the optical gain. The computation of the gain is not very precise and thus the measurement of the gain is needed, to model gain layers and thus to optimize the active optical devices, such as lasers or optical amplifiers. However, the gain measurement is very challenging for on-chip applications such as silicon photonics. The reason is that existing techniques and methods involve cleaving facets or require numerous devices, which is unattractive for implementation in on-chip applications, as this method is time consuming, destructive and/or due to the large real-estate consumption. Moreover, such techniques can require high resolution spectrometers in order to resolve the oscillations in the output power spectrum. In addition, the majority of the existing concepts can only extract the optical gain below or around threshold, which are to common modes of operation for a laser device. Thus, the known standard techniques do not make it possible to characterize gain properties at the operation condition of the gain material under realistic pumping conditions as used in a light emitting device of interest (i.e., at pumping current densities being equivalent to the operation conditions of the targeted laser).

In conclusion, no appropriate device exists, which allows to simply measure the gain of an on-chip optical device, i.e., without fabricating numerous devices, having to cleave the device or polish its facets, to apply multiple contact to the gain measurement structure, or to measure the gain accurately above threshold under realistic pumping/operating conditions.

SUMMARY OF THE INVENTION

According to a first aspect, the present invention is embodied as a photonic circuit device for optical gain measurement, including: a substrate with a photonic circuit, the latter including one or more waveguides defining two waveguide portions aligned along a same direction; an active gain section, on top of the substrate and coupled in the device for generating light by electrical pumping or optical pumping; at least two light couplers arranged such that at least a part of the active gain section is between the light couplers, and configured for coupling light between the active gain section and the waveguide portions; and a partial reflector arranged so as to reflect light propagating along the same direction back to a center of the gain section, and wherein the device does not include any other reflector opposite to the partial reflector with respect to the active gain section and configured to reflect light back to the center of the gain section.

In embodiments, the light couplers are longitudinally extending along the same direction.

Preferably, the light couplers include, each, at least one tapered portion, the tapered portion terminating a waveguide portion or being connected to the active gain section and wherein, preferably, the tapered portions have, each, essentially parabolic shapes.

In preferred embodiments, the light couplers include, each, two tapered portions, which are oppositely oriented and overlapping, wherein a first one of the two tapered portions terminates a respective waveguide portion and a second one of the two tapered portions connects to the active gain section.

Preferably, each of the waveguide portions includes an additional light coupler, the partial reflector being between one of the light couplers and such an additional light coupler, wherein each additional light coupler is preferably located at an end of the each of the waveguide portions that is opposite to the other end of the each of the waveguide portions that is the closest to the light couplers.

In embodiments, the additional light couplers are grating couplers, configured for enabling vertical measurement of light emitted at the additional light couplers.

Preferably, the photonic circuit is a silicon photonic circuit, and, more preferably, the substrate further includes an electrical circuit in addition to the photonic circuit.

In preferred embodiments, the waveguide portions extend, each, directly on a dielectric layer of the device, wherein, preferably, the dielectric layer is on top of the substrate and has a thickness of more than 1 micron.

Preferably, each of the one or more waveguides is in contact with a bonding layer, and preferably is partly embedded in the bonding layer, and more preferably has one surface level with a surface of the bonding layer, the bonding layer being preferably one of: a polymer; $SiO_2$; or $Al_2O_3$ or any combination thereof.

In embodiments, the gain section includes one or more of: a III-V semiconductor material, a II-VI semiconductor material, a semiconductor such as germanium, semiconductor alloys such as silicon germanium, a polymer, a material including embedded quantum dots and/or quantum dashes, or a quantum well material.

Preferably, the gain section is a III-V semiconductor material gain section, including: a bottom contact layer, including a first metal contact; and an upper part, on top of the bottom contact layer, and including a second metal contact.

In preferred embodiments, the gain section includes an epitaxial layer stack, the latter including a n-doped semiconductor, at least part of which forms at least part of the bottom contact, and wherein the epitaxial layer stack further includes an upper stack, forming at least part of the upper part of the III-V semiconductor material gain section, and which itself includes: a first intrinsic semiconductor on top of the n-doped semiconductor; a multiple quantum well section on top of the first intrinsic semiconductor; a second intrinsic semiconductor on top of the multiple quantum well section; and a p-doped semiconductor on top of the second intrinsic semiconductor.

In particularly preferred embodiments, the photonic circuit includes two waveguides, each defining one of the waveguide portions; and the light couplers are configured for enabling coupling of light between, one the one hand, the active gain section and, on the other hand, each of the two waveguides, wherein each of the two light couplers includes two tapered portions, which are oppositely oriented and overlapping, and wherein: a first one of the two tapered portions forms an end of one of the waveguide portions; and a second one of the two tapered portions is connected to the active gain section and preferably forms a part thereof.

In variants, the photonic circuit includes only one waveguide that defines the two waveguide portions, the waveguide preferably having a varying cross-section, the latter more preferably having a middle portion that has a reduced width compared to outer portions of the waveguide, which outer portions define the two waveguide portions.

According to another aspect, the invention can be embodied as a method of optical gain measurement, including: providing a device according to any one of the above embodiments, wherein the two waveguide portions includes a first waveguide portion and a second waveguide portion; exciting the gain section to generate light therein, by electrical pumping or optical pumping; letting generated light transfer to each of the two waveguide portions, thanks to the light couplers, the light being partly reflected at the partial reflector; and sensing both the optical power of light emitted from the first waveguide portion and the optical power of light emitted from the second waveguide portion to evaluate the optical gain of the active gain section, wherein sensing is performed such that: the light emitted from the first waveguide portion includes both light generated and directly transferred to the first waveguide portion; and light generated, reflected at the partial reflector and then transferred to the first waveguide portion, and the light emitted from the second waveguide portion includes light that was not reflected at the partial reflector.

In embodiments, each of the waveguide portions of the device provided includes an additional light coupler, the partial reflector being between one of the light couplers and such an additional light coupler, the latter preferably located at an end of the each of the waveguide portions that is opposite to the other end of the each of the waveguide portions that is the closest to the light couplers; and the optical power of light emitted is sensed at each of the additional light couplers to evaluate the optical gain of the active gain section.

Preferably, sensing the optical power is performed via optical fibers or photodetectors located in the vicinity of each of the additional light couplers.

Devices, apparatuses and methods embodying the present invention will now be described, by way of non-limiting examples, and in reference to the accompanying drawings. Technical features depicted in the drawings are not to scale.

BRIEF DESCRIPTION OF SEVERAL VIEWS OF THE DRAWINGS

FIGS. 1-5 depict devices at an intermediate stage of the fabrication;

DETAILED DESCRIPTION OF THE INVENTION

The following description is structured as follows. First, general embodiments and high-level variants are described (sect. 1). The next section addresses more specific embodiments and technical implementation details (sect. 2).

1. General Embodiments and High-Level Variants

In reference to FIGS. 1-9 and 11-15, an aspect of the invention is first described, which concerns a photonic circuit device 100 for optical gain measurement. This device is provided with on-chip gain measurement structures, which makes it possible to easily measure the optical gain measurement of an active gain section.

First, the device 100 includes a substrate 10 with a photonic circuit. The substrate is preferably a silicon wafer but can also be made from Gallium Arsenide (GaAs) or Indium Phosphide (InP). The substrate can notably include: a silicon photonic circuit; a passive InP photonic circuit; or a passive GaAs photonic circuit. It shall hereafter be referred to as a "wafer", for simplicity. Still, a typical product can involve a single die, as usual in the art.

The photonic circuit includes one or more waveguides 71, 72. In most embodiments described herein, it includes two waveguides, subject to the exception of the embodiments described in reference to FIG. 3. In all cases, the one or more waveguides 71, 72 define two waveguide portions (at least), which are aligned along a same direction, as apparent in FIGS. 1-9. "Waveguide portion" means a waveguide core portion, as usual in integrated photonics or silicon photonics. Surrounding components, layers or materials, etc., play the role of a cladding. Other components of the photonic circuits are not represented in the appended drawings for conciseness.

The device 100 further includes an active gain section 62-66, on top of the wafer and coupled in the device for generating light by electrical pumping or optical pumping. The active gain section 62-66 can for instance be bonded (directly or not) on top of the wafer. In variants, there can be an interface in-between. The active gain section could be bonded directly, using molecular bonding or a layer of polymer or $SiO_2$ or, still, a bilayer of $Al_2O_3$ and $SiO_2$ or a combination thereof. However, using a bilayer of $Al_2O_3$ and $SiO_2$ is preferred because $SiO_2$ is a standard material in CMOS processes and $Al_2O_3$ improves the bonding energy. Note that "on top of" means above (or below) and not necessarily "in direct contact with", as consistently assumed in the art. Accordingly, if layer a of material A is "on top of" layer b of material B, then there is at least a partial overlap between layers a and b.

Figure 6A:
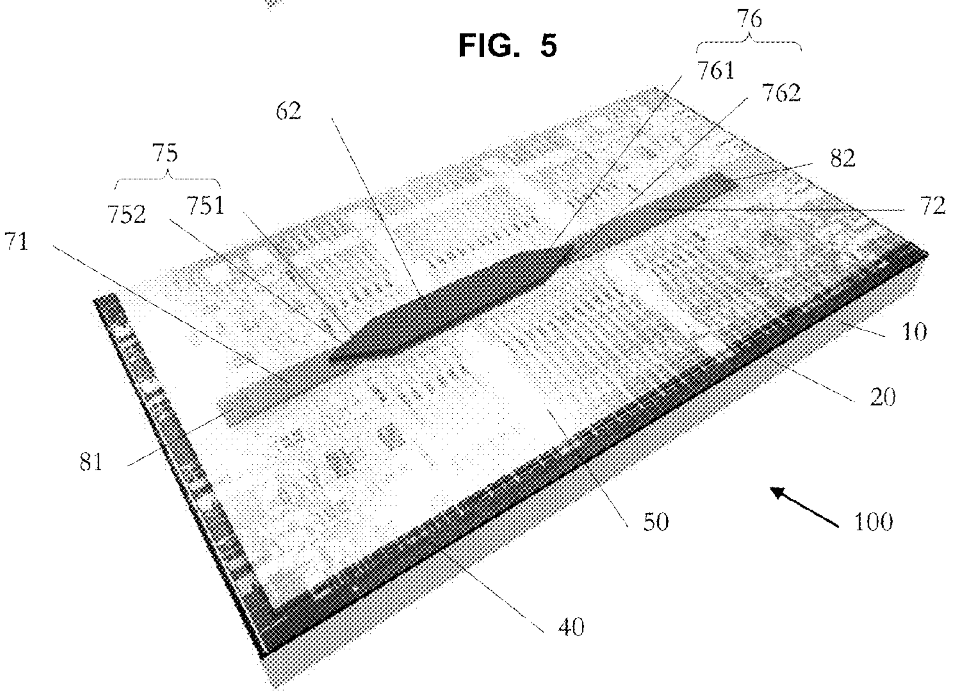
FIGS. 6B and 8B schematically illustrate a top view of the devices of FIGS. 6A and 8A, respectively.
Figure 6B:
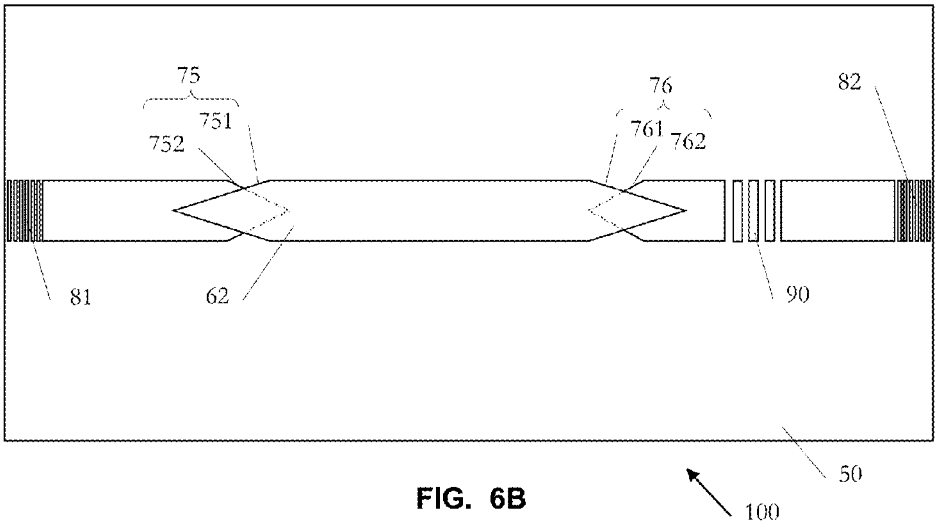
Figure 7:
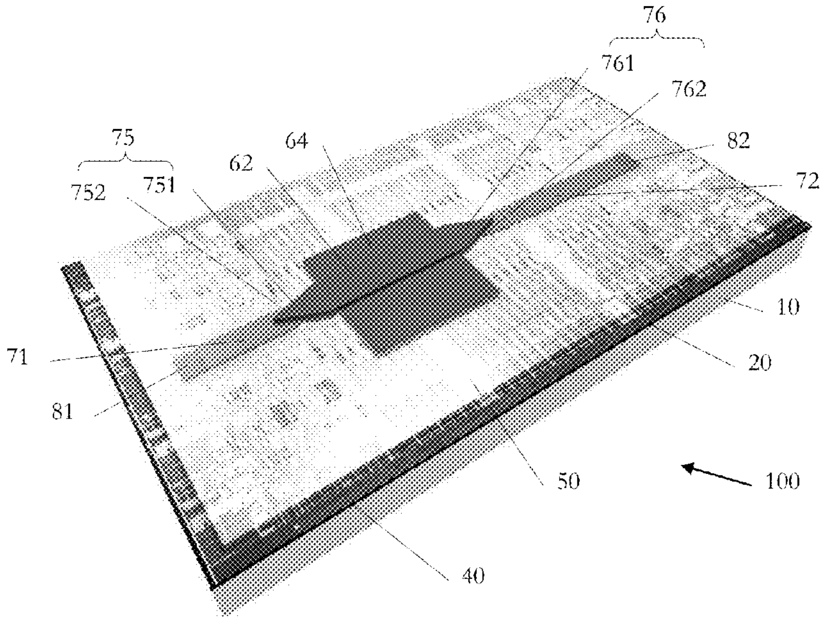
Figure 8A:
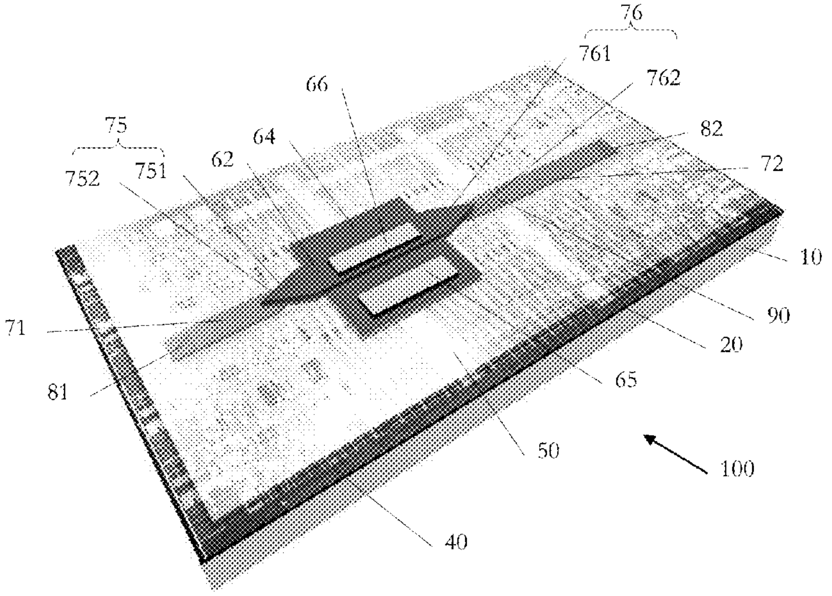
Figure 8B:
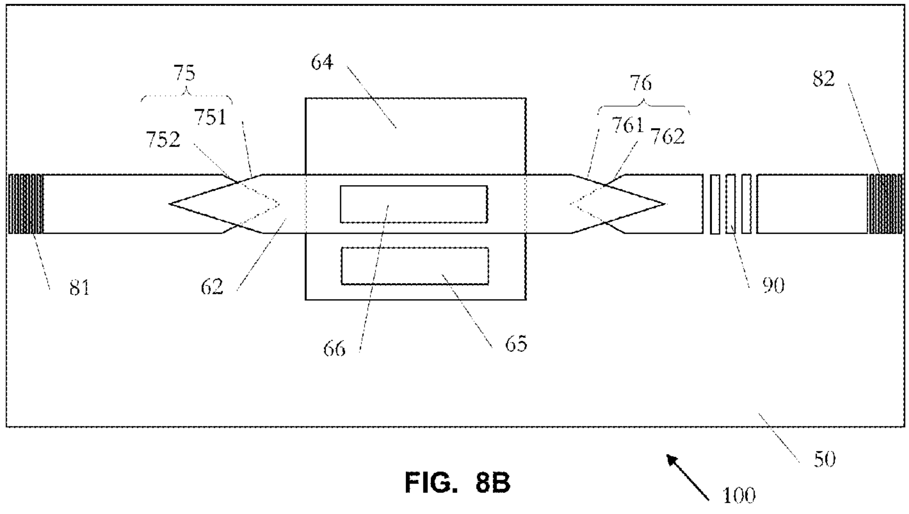

At least two light couplers 75, 76 are further provided, which are arranged such that at least part of the active gain section is between the light couplers, as better seen in FIGS. 6-8. These couplers are, each configured for coupling light between the active gain section and the waveguide portions. Thus, they allow the light generated in the gain section to be transferred to the waveguide portions 71, 72. As explained later in detail, the light couplers 75, 76 can for instance be provided in the waveguide portions 71, 72 and/or in the active gain section. I.e., the couplers can be obtained by patterning: (i) the photonic circuit's waveguide portions; (ii) the gain section (e.g., III-V materials); or (iii) both the waveguide portions and the gain section. The light couplers can notably be placed on top of a surface of a layer contiguous with the wafer or a surface of the wafer itself. Preferably, the couplers 75, 76 are shaped and placed such as to enable adiabatic coupling of the light between the active gain section and the waveguide portion (adiabatic meaning no substantial loss and no substantial back reflection).

Finally, the device 100 includes a reflector 90 arranged so as to reflect light propagating along the same direction back to a center of the gain section. Importantly, the device 100 does not include any other reflector on the other side of the gain section, i.e., there is no additional reflector opposite to the partial reflector 90 with respect to the active gain section that could possibly reflect the light back to the center of the gain section. In other words, the partial reflector 90 is asymmetrically arranged (and configured) with respect to the center of the gain section, e.g., on one side only of the gain section. Still, the partial reflector 90 could in fact be part of the active gain section, since its function is to reflect part of the generated light back to the center of the gain section, from one side only.

As the skilled person knows, a reflector will never reflect 100% of the light (the "partial reflector" is therefore simply referred to as a "reflector" in the following). It is here precisely relied on this property to measure the optical gain, as to be explained later. The present invention can, in principle, be embodied with any reflector that only partly reflects light. Preferably, the reflector 90 should reflect between 10 and 90% of the light hitting it. A more preferred range is between 40 and 60% (e.g., a 50% reflection), which in practice allows to achieve better suited asymmetries of light power in each waveguide 71, 72, for measurement purposes. Note that more than one reflector 90 could be present on one side of the center. Also, in this invention, "light" must be understood as "electromagnetic radiation", i.e., it does not necessarily restrict to visible light, notwithstanding some applications cited herein. It is for instance common in the present technical field to speak of "infrared light".

Most conveniently, the reflector 90 is arranged in the waveguide portion 72, as seen in FIGS. 1-4. It could, in variants, be arranged at an end of the gain section, close to the coupler 76, so as to intercept the optical path and reflect light back to the center of the gain section. Even, the reflector 90 is preferably the only reflector that interacts with light generated by the gain section, in the optical path defined by the direction along which the waveguide portions 71, 72 are aligned (besides additional couplers 81, 82 that are discussed below).

Such a device circumvents the drawbacks of the prior art listed in the background section; it is well suited for characterizing the gain spectrum of on-chip devices such as laser devices or optical amplifiers. The description of the related gain measurement methods will make it apparent that the gain of an on-chip optical device can easily be measured, directly on the wafer, and without requiring the fabricating of numerous devices, cleaving or polishing facets, or still having to apply multiple contacts to the gain measurement structure, or to measure the gain accurately under realistic bias conditions, i.e. above threshold of a laser device. In contrast, the present methods essentially require sensing the optical power of light emitted from the waveguide portions, from which the gain can next be evaluated. These methods will be described later in detail.

Several ways of coupling light are known. The light couplers 75, 76 are preferably longitudinal couplers, i.e., longitudinally extending along the direction of extension of the waveguide portions 71, 72, see, e.g., FIGS. 6-8. This direction corresponds to the main direction of propagation of light in the couplers and the waveguide portions (light can propagate both ways along the direction). Using longitudinal light couplers 75, 76 is preferred as they more easily enable adiabatic coupling between the waveguide portions and the gain section.

As seen in FIGS. 1, 2, 4, and 6-8, the light couplers 75, 76 can for instance include, each, at least one tapered portion 752; 762, where a tapered portion terminates a waveguide portion 71, 72 or is connected to the active gain section. The tapered portions can have an essentially parabolic shape, i.e., the lateral edges of the tapered portions are parabolic, and more generally can be nonlinear. A suitable design of the tapered portions allows a smoother transformation of the optical mode, ensuring minimal scattering to the unwanted modes and shorter length of the tapered section. Further investigations on this matter have shown that a parabolic shape is actually not the most optimal geometry. Still, it can be regarded as an approximation to the optimal geometry, and at least as a better approximation than linear tapers.

Nonlinear tapers can be obtained using a single non-linear taper section or multiple taper sections, e.g., a linear section, followed by a non-linear for example parabolic section, itself followed by a linear section, etc. Preferred designs of the taper depend on the coupling efficiency target, geometry and refractive indices of the waveguides, and the size limitations. Depending on the available fabrication techniques, it can be more practical to approximate a non-linear taper portion by multiple successive linear sub-portions.

The conditions for achieving adiabatic light coupling between tapers were explored in several papers. Analytical formulas describing tapers having optimal designs can be found in the literature. However, optimal taper parameters (adapted to the present context) can be obtained from finite-difference time-domain (FDTD) simulations solving Maxwell's equations in time-domain. This numerical method allows very accurate solutions of the taper parameters to be computed.

Preferably, the reflector 90 is arranged at an end of a tapered portion of one of the waveguide portion, e.g., at the end of the tapered portion 762 (in that case it is integrated in the waveguide portion 72), as illustrated in the appended drawings. In variants, the reflector 90 can be located at an end of the tapered portion 761 (in that case it is integrated in the gain section, at a periphery thereof). The closer the reflector to the periphery of the gain section, the less losses and the more accurate the measurements. In terms of fabrication, however, it is easier to fabricate the reflector in one of the waveguide portions, because the fabrication processes for waveguides are more mature and can resolve smaller features. Silicon is for instance preferred. Thus, providing the reflector at the end of a tapered portion 762 provides a satisfactory trade-off. More generally, the reflector can be located at the beginning of a coupler, e.g., in the active gain section or at the end of a coupler, e.g., coupler 76 in the figures, independently from the actual embodiment of the latter.

Referring now to FIGS. 6-8, each of the light couplers 75, 76 can, in embodiments, include two tapered portions 751, 752; 761, 762. Consider the light coupler 75: it can have two tapered portions 751, 752 that are oppositely oriented and at least partly overlap. One of the tapered portions 752 terminates the waveguide portion 71, while the other tapered portion 751 is part of (or at least connects to) the active gain section 62-66, such as to efficiently optically couple the gain section to the waveguide portions.

As seen in FIGS. 1-8, the device 100 can include additional light couplers 81, 82, directly integrated therein, to enable gain measurement. Namely, an additional light coupler 81, 82, can be included in each of the waveguide portions 71, 72, such that the reflector be located between one 76 of the light couplers and one of these additional couplers 82. Each additional light coupler 81, 82 is preferably located at an end of a waveguide portion, i.e., opposite to that end that is the closest to the light couplers 75, 76. For example, the additional light couplers 81, 82 can be grating couplers, thereby making it possible to sense light vertically, i.e., to sense light emitted at an additional light coupler, perpendicularly to the surface including the waveguide portions. In variants, the additional light couplers could be configured for lateral measurement of emitted light. In other variants, the additional light couplers could be part of a sensing device (extrinsic couplers, not part of the device 100). The reader is referred to the paper "Flexible metal grating based optical fiber probe for photonic integrated circuits", by Stijn Scheerlinck et al., Appl. Phys. Lett. 92, 031104 (2008), where light is coupled between probe and waveguide without the need for integrated coupling structures.

Figure 2:
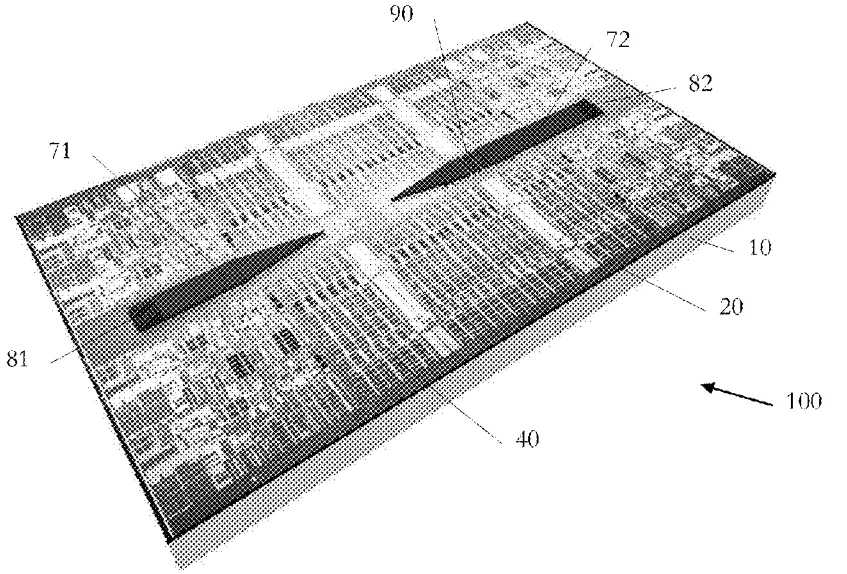
Figure 3:
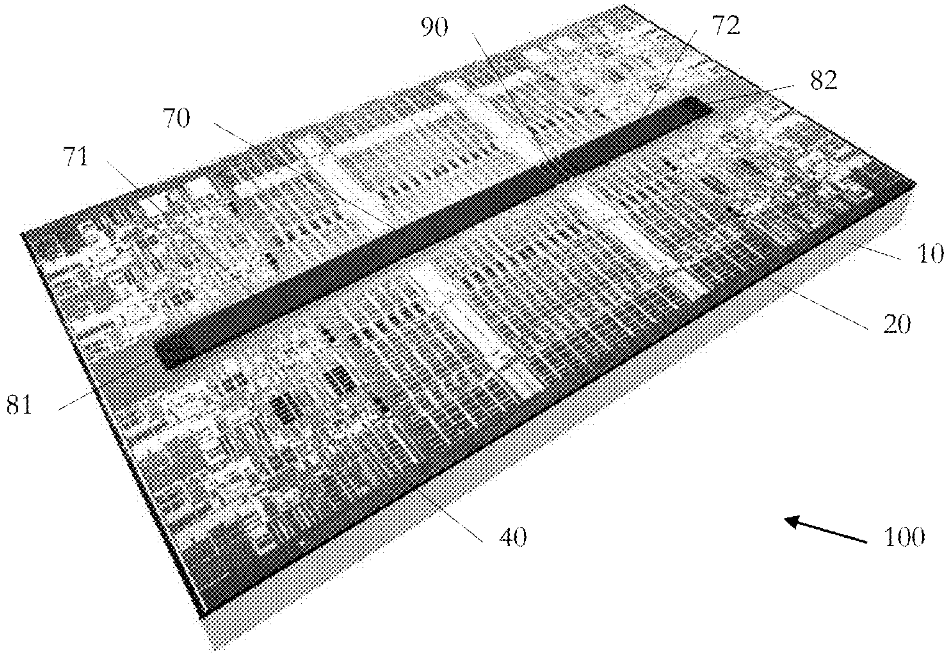

As the earlier, the photonic circuit is preferably a silicon photonic circuit. As illustrated in FIGS. 2, 3, the wafer can further include an electrical circuit 40 in addition to the photonic circuit. The electrical circuit 40 can for instance be a complementary metal-oxide-semiconductor (CMOS) front end. More generally, the wafer can further include electronics.

Figure 1:
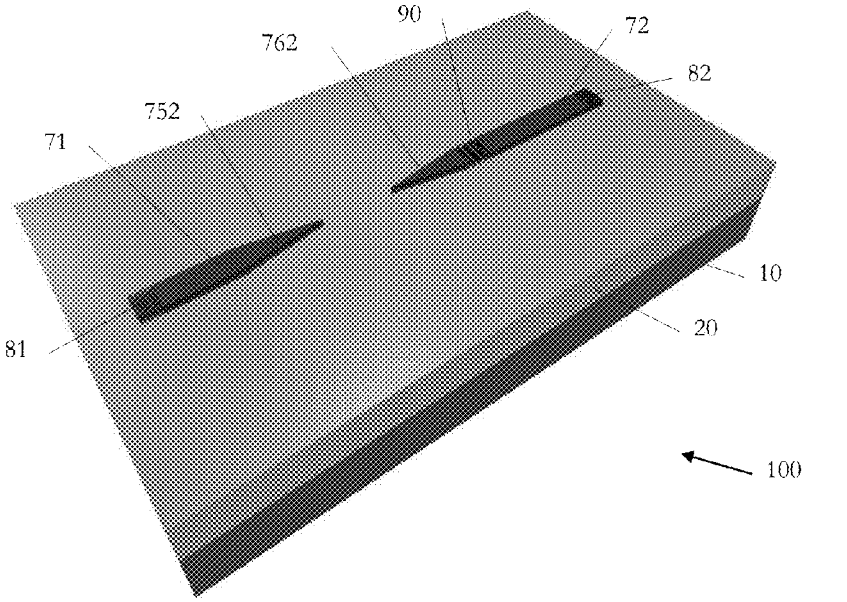
FIGS. 1-6, 7 and 8A show 3D views of simplified representations of photonic circuit devices, at various stages of their fabrication, and according to embodiments.

As better seen in FIG. 1, each of the waveguide portions 71, 72 can extend directly on a dielectric layer 20. The dielectric layer can be provided on top of the wafer. This dielectric layer 20 can be referred to as a buried oxide, e.g., $SiO_2$. It preferably has a thickness of more than 1 micrometer. The actual minimal thickness depends on the wavelength of the generated light: the light wavelength preferably used is, e.g., 1.3-1.55 micron. The dielectric layer provides a lower cladding for the waveguide portions, while providing a thermal and mechanical interface to the wafer. The dielectric layer 20 can thus advantageously be used to tune the mechanical and thermal properties of the device.

Figure 11:
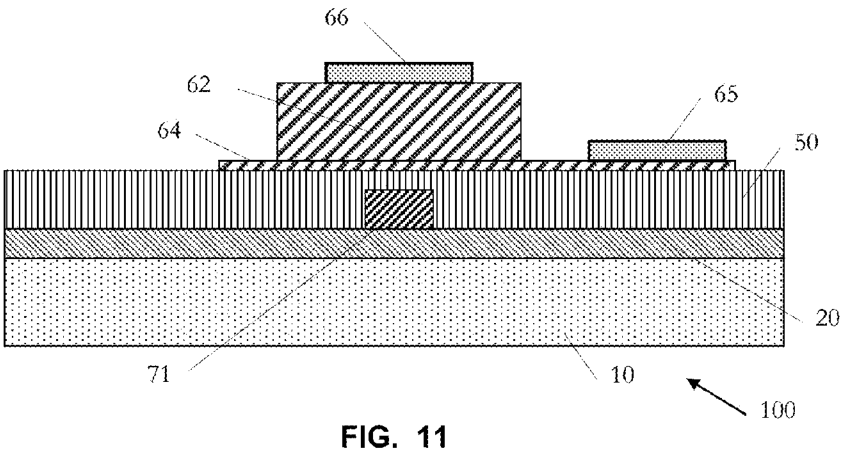
FIG. 11 is a cross-section view of a simplified representation of a device such as depicted in FIG. 8.
Figure 12:
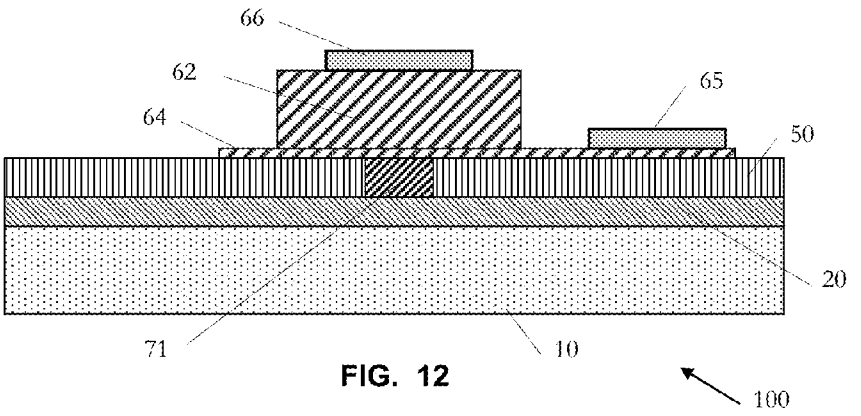
FIG. 12 is a cross-section view of a simplified representation of a variant to the device of FIG. 8.
Figure 13:
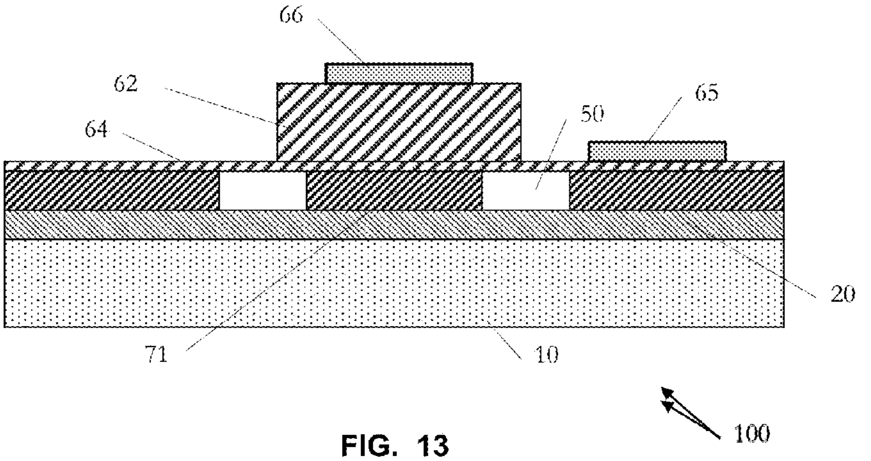
FIG. 13 is a cross-section view of a simplified representation of another variant to the device of FIG. 8.
Figure 14:
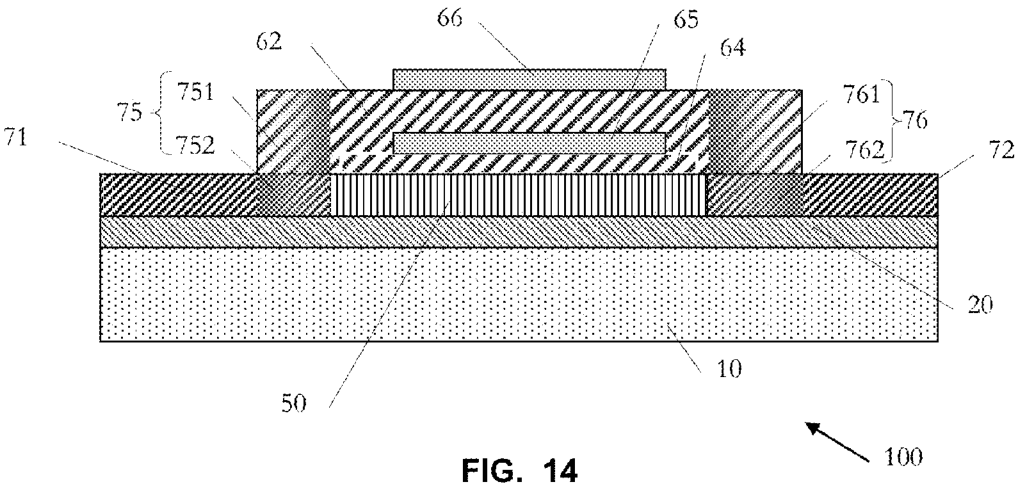
FIG. 14 is a (longitudinal) side view of a simplified representation of a device such as depicted in FIG. 8.

Referring now to FIGS. 4, 6-8, the waveguides 70-72 can be in contact with a bonding layer 50, the latter being typically a polymer, $SiO_2$ or $Al_2O_3$ (or any combination thereof). Again, a bilayer of $Al_2O_3$ and $SiO_2$ could serve as an interface. The waveguides 70, 71, 72 can be partly immersed in the bonding layer 50, as illustrated in FIG. 11, which makes it possible to tune the properties of the couplers 75, 76 by adapting the thickness of the bonding layer 50. They can nonetheless have one surface level with a surface of the bonding layer 50, as illustrated in FIG. 12, which reduces variations of the coupling properties of the couplers 75, 76 induced by thickness variations of the bonding layer 50. If the bonding layer 50 is flush with the surface of the photonic circuit, the latter determines the height or the thickness of the bonding layer 50 very accurately. In other variants, the device could be designed such that the waveguides 70, 71, 72 are partly surrounded (laterally) by air, as illustrated in FIG. 13. This enables easier bonding of gain material onto the wafer as light can be pushed out through the voids reducing the risk of air bubbles in and delamination of the bonded gain material.

The gain material can be bonded on top of the bonding layer 50. In variants, the active gain section can be arranged (directly or not) on top of the waveguide portions, using molecular bonding.

Referring now to FIGS. 6-8 and 11-15, the gain section 62-66 shall preferably include a III-V semiconductor material. In variants, it can include a II-VI semiconductor material, germanium, semiconductor alloys such as silicon germanium, or a polymer. The semiconductors used can be doped, if necessary, and preferably in conjunction with strain, e.g., to make the bandgap direct instead of indirect (when for instance using germanium). Combinations of such material can further be contemplated. It can further include a material including embedded quantum dots or a quantum well material. For example, the gain section 62-66 can include a III-V semiconductor material, and notably include a bottom contact layer 64 (with a first metal contact 65) and an upper part 62, on top of the bottom contact layer 64 (with a second metal contact 66). Reasons for doing so will become apparent later.

Figure 15:
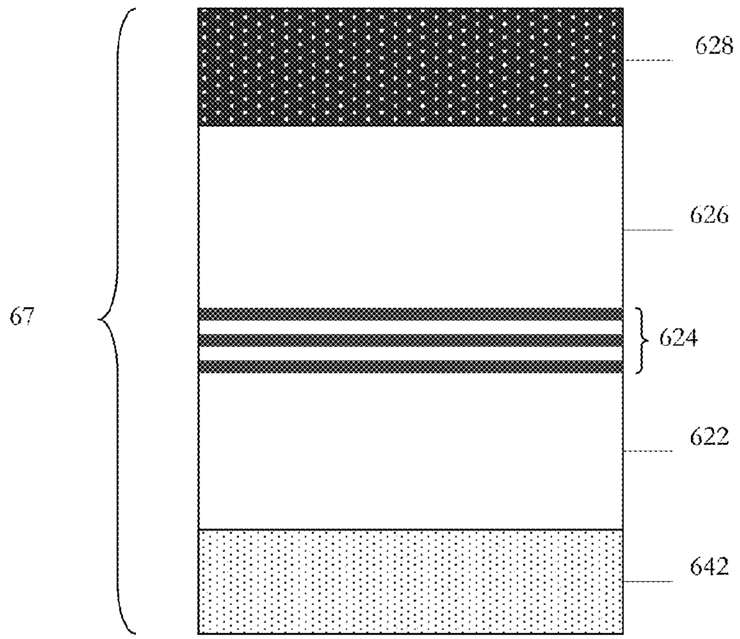
FIG. 15 is a sectional view of an epitaxial layer stack that forms (part of) a III-V semiconductor material gain section, as involved in embodiments.

As illustrated in FIG. 15, the gain section 62-66 can include an epitaxial layer stack 67. The latter can include a n-doped semiconductor 642, a part of which can form (at least part of) the bottom contact 64. Namely, the layer 64 can be essentially formed by the layer 642, subject to a residual part of layer 642, especially if the latter is formed by patterning the epitaxial layer stack 67 (for example by lithography and etching). The epitaxial layer stack 67 further includes an upper stack, which forms (at least part of) the upper part 62 of the III-V semiconductor material gain section. In FIG. 15, the upper stack includes: a first intrinsic semiconductor 622, arranged on top of the n-doped semiconductor 642; a multiple quantum well section 624 on top of the first intrinsic semiconductor; a second intrinsic semiconductor 626 on top of the multiple quantum well section; and a p-doped semiconductor 628 on top of the second intrinsic semiconductor.

The afore-mentioned layer stack is easy to grow, either by molecular beam epitaxy (MBE) or by metal-organic chemical vapour deposition (MOCVD). In particular, the gain stack has the advantage that the n-doped section is in proximity with the waveguide. This is particularly attractive as the p-doped section typically has a ten-times higher optical loss for the same doping level or concentration of dopants residing in the contact layers 628 and 642, respectively.

In variants, the gain stack can also include a tunnel junction enabling to terminate the device with a n-contact on either side, such that only one type of contact metal needs be applied, e.g., gold, tungsten, titanium, etc., it being reminded that, normally p- and n-doped regions use different types of metal to match the Fermi-levels and reduce the contact resistance.

A preferred example of implementation is the following (illustrated in FIGS. 6-9 and 14). First, the photonic circuit includes two separated waveguides 71, 72 (which define, each, a waveguide portion as evoked earlier). Second, the light couplers 75, 76 couple light between the active gain section and each of the two waveguides, see FIG. 9. To that aim, each light coupler 75, 76 includes two tapered portions, oppositely oriented and overlapping, as discussed earlier. Namely, one of the tapered portions 752, 762 forms an end of a waveguide portion, while the other 751, 761 tapered portion is connected to the active gain section 62-66 (it preferably forms part thereof). The taper portions 751, 761 widen towards the center of the active gain section, while the tapered portions 752, 762 (the waveguides' tapers) narrow towards the center of the active gain section.

As evoked earlier, such a configuration has shown to improve the adiabaticity of the coupling. Adiabaticity is achieved when the optical distribution is defined by the same eigenmode (i.e., supermode of the coupled waveguide system, e.g., fundamental even supermode, fundamental odd supermode) throughout the taper, with minimal scattering to other supermodes or radiation modes. Still, the loss is never perfectly zero. Adiabaticity is a relative term, as known in the art; a coupler is considered to be adiabatic when the loss is below a predefined level, e.g. less than 15%, but typically less than 10%.

The embodiments of FIGS. 6-9 involve four tapered portions (in total). In variants, only two tapered portions (in total) can be provided, e.g., each forming part of the active gain section. In other variants, only two tapered portions are provided, each provided in a respective one of the waveguide portions.

The waveguide portions are not necessarily defined by respective, well defined waveguides. For example, in FIG. 3, only one waveguide 70 is provided, which defines the two waveguide portions 71, 72 (note that FIG. 3 and more generally FIGS. 1-5 depict devices at an intermediate stage of the fabrication). The waveguide 70 can have a varying cross-section (not shown). For example, the latter can have a middle portion with a reduced width compared to outer portions 71, 72, which define the two waveguide portions 71, 72.

Figure 9:
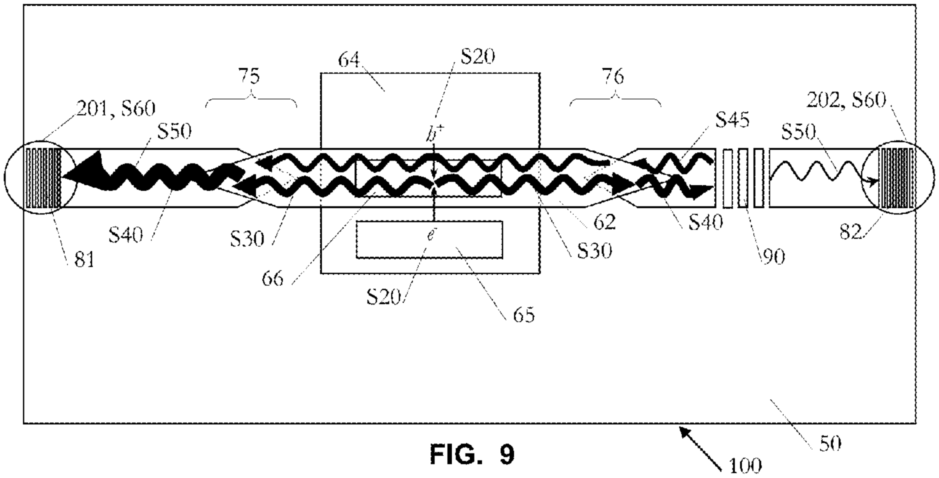
FIG. 9 shows the same top view as in FIG. 8B, and further illustrates how light is generated, transferred, propagated and reflected therein, according to embodiments of methods according to the invention.
Figure 10:
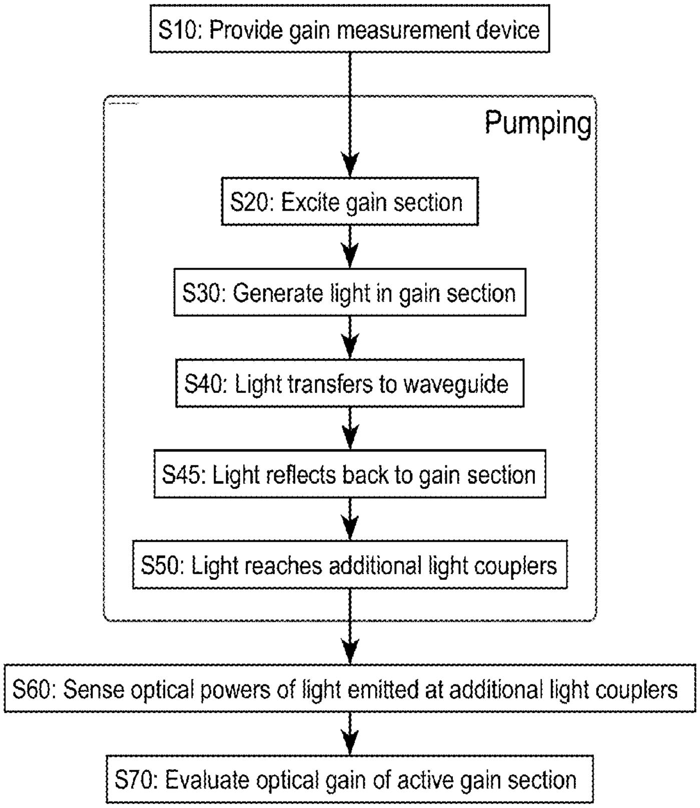
FIG. 10 is a flowchart illustrating high-level steps of methods of measuring optical gain in devices such as depicted in FIGS. 1-9 and 11-15, according to embodiments.

At present, methods of optical gain measurement are discussed, which make use of devices such as described above. Referring more specifically to FIGS. 9, 10, such methods basically include the following steps:

First, a device 100 such as discussed herein is provided S10. Second, the gain section 62-66 is excited S20, in order to generate S30 light therein. As per the specification of the device described above, the gain section can be excited by electrical pumping or optical pumping.

The gain section can for instance be excited electrically (electrical pumping) by using electrical probes, wire-bonds, flip-chip bonding or soldering, etc. The gain section can else be excited optically (optical pumping) by way of a light pulse or by using continuous-wave light. As schematically illustrated in FIG. 9, an electron-hole pair (e.g., created in the epitaxial layer stack 67, in particular in the quantum well 624 of FIG. 15) can recombine in the gain section to create a photon.

Then, one let the generated light transfer S40 to each of the waveguide portions 71, 72, thanks to the light couplers 75, 76; the light is (at least partly) reflected S45 at the reflector 90, resulting in an asymmetry between optical power in the first waveguide portion 71 vs. the second waveguide portion 72; and finally, one senses S60 the optical powers of light emitted from each of the waveguide portions, to evaluate S70 the optical gain of the active gain section 62-66. Namely, both the optical power of light emitted from the first waveguide portion 71 and the optical power of light emitted from the second waveguide portion 72 are sensed. Optical powers are sensed in such a way that: light emitted from the first waveguide portion includes light that was both directly and indirectly transferred to it, namely: light that was generated S40 and then directly transferred S40 to the first waveguide portion 71; and light that was generated S40, then reflected S45 at the reflector 90 and then transferred S40 to the first waveguide portion, whereas the optical power of light emitted from the second waveguide portion 72 is sensed "after" the reflector 90, i.e., light emitted from the second waveguide portion 72 includes that light that was not reflected at the reflector 90, that is, that part of light that passed through the reflector. In other words, the optical power of light sensed at the second portion 72 includes only the light that was not reflected at the reflector 90 (subject to negligible losses and light contamination effect from the environment of the second portion 72).

In that respect, it is understood that residual losses can occur, notably when the light transfers to the waveguide portions and propagates therein, reflects at the reflector, and/or is emitted from the additional couplers.

Because of the asymmetric reflector 90, the intensity of light in the left-hand side waveguide portion 71 of FIG. 9 is greater than the intensity in the right-hand side portion 72, as denoted by the various widths of the curved arrows. The gain to be measured basically reflects an asymmetry between these intensities. The gain is not directly measured, but instead computed. Typically, the optical powers are sensed, in order to measure intensities (and then emission rates), to eventually obtain the optical gain. More explicit details are given in the next section.

In preferred embodiments, each of the waveguide portions 71, 72 includes an additional light coupler 81, 82 (e.g., located at the opposite ends of the waveguide portions). The optical power of light emitted can therefore be sensed S60 at the additional light couplers 81, 82 (and notably after the reflector 90 for what concerns the second portion 72). Step S60 can notably be performed via optical fibers 201, 202 or photodetectors put in the vicinity of the additional light couplers 81, 82. The device 100 can include (or not) such sensing means, i.e., optical fibers 201, 202 or photodetectors.

The above embodiments have been succinctly described in reference to the accompanying drawings and can accommodate a number of variants. Several combinations of the above features can be contemplated. Examples are given in the next section.

2. Specific Embodiments/Technical Implementation Details

More specific embodiments and variants thereof are now described. Such embodiments revolve around a device, which resembles a test structure for measuring the on-chip optical gain on a chip, and whose key advantages are that the gain can be measured: By using electrical pumping; By establishing two contacts only and at once; By using vertical fiber probing (thus enabling wafer-scale testing); Without facet polishing; Without fabricating and measuring numerous test structures (one device suffices); Without having to apply numerous (>2) contacts; and Without requiring high spectral resolution.

An integration scheme is disclosed, where an optically active based gain section made of Germanium, GaAs, InP, InGaAs, InAlAs, InGaAsP, NAsP, GaSb, any of their alloy, or any other suitable compound semiconductor, is evanescently coupled to a waveguide, or forms a hybrid mode with a waveguide, preferably made from silicon. This is realized by bonding the active optical layer (i.e., the gain section) directly onto the silicon waveguide, or on top of the bonding layer 50, which can be fabricated using a lower index material, preferably silicon dioxide, silicon nitride, aluminia, or a combination thereof. The layer 50 can further be made from an adhesive material, such as a polymer, or from any other suitable solid state material or a combination thereof.

The preferred integration scheme is based on molecular bonding. A III-V based material is grown on a suitable substrate (III-V semiconductor, Si, Ge, etc.) and optionally covered with a dielectric by molecular beam epitaxy, molecular vapor phase epitaxy, metal-organic chemical vapor deposition, atomic layer epitaxy, atomic layer deposition, sputtering or any other suitable thin film deposition technique. Then, this layer is bonded on top of the electronics wafer including the front end electronics and optics. Either a full III-V layer stack serving as gain material is bonded, or a seed-layer for successive re-growth is bonded, or a III-V layer stack including both gain material and seed layer with appropriate etch-stops is bonded.

The bonding is preferably performed on top of a dielectric layer 20 residing on the CMOS wafer 10. In state-of-the-art CMOS processes, this layer is a silicon-dioxide layer, which has been polished by chemo-mechanical polishing (CMP) to provide a flat surface exhibiting low surface roughness.

Since either wafers or wafer-scale bonded III-V based layers are used, the integration scheme lends itself for mass-fabrication and an easy integration with current back-end fabrication schemes.

The gain test structure within the III-V layer will be electrically connected during these back-end fabrication schemes. This way, a gain test structure can be fabricated for wafer-scale testing.

Furthermore, this test structure can be driven by the electronics and coupled to the optics residing in one common layer, i.e., the top silicon layer. The optical signal is coupled out by grating couplers 81, 82, which enable vertical probing and thus wafer-scale testing. An example of such a device is shown in FIG. 8. At present, variants to the device and the fabrication methods are described.

The structures can be designed such that an active material (e.g., a III-V-based material) 62-66 is bonded on top of a wafer 10 including a silicon photonics circuit, as shown in FIG. 1 (representing an early, intermediate phase of fabrication of an embodiment of the present invention). The silicon photonic circuit includes grating couplers 81, 82 on either end of the waveguide portions 71, 72, a reflector 90 with reflectivity R and taper portions 751, 761. Moreover, the silicon photonics circuit is residing on an oxide layer 20 (buried oxide), which again is located on the silicon wafer 10, thus forming a silicon-on-insulator (SOI) structure.

As noted in the previous section, embodiments of the invention involve a substrate that includes a silicon photonic circuit as before and, in addition, a CMOS or bipolar (Bi) CMOS front-end-of-line (FEOL) 20 as shown in FIG. 2. This figure displays the stack of the preferred embodiment including electronics 40, passive photonics, the wafer 10 and the buried oxide layer 20; it shows a host substrate including electronics 40 and photonic components, including the additional means 81, 82 of coupling (e.g., grating couplers), tapered waveguide portions 71, 72 and a reflector 90. The transistors and also the photonics are fully processed, i.e., including silicide, implantations and annealing steps.

In the variant of FIG. 3, the substrate is essentially identical to the embodiment in FIG. 2, except that instead of two adiabatic coupling sections 752, 762, the waveguide 70 between the grating couplers 81, 82 is not structured.

Figure 4:
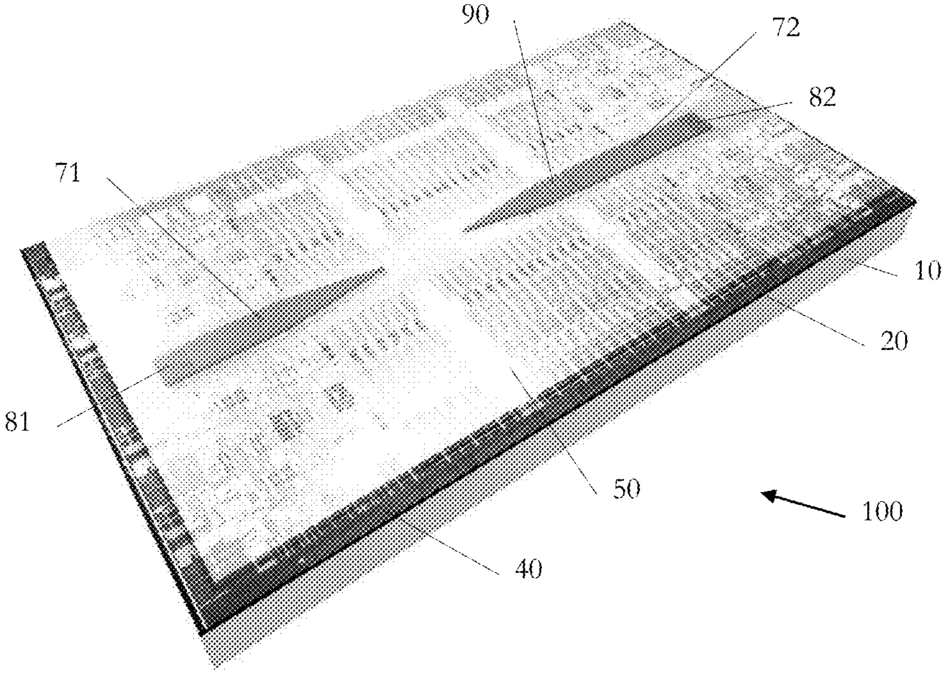

After fabrication of the silicon photonics 70-72 and the front-end of line 40, the device is further processed. The next fabrication step is the deposition of a layer 50 suitable for bonding. The layer can be a polymer (for adhesive bonding) or, in preferred embodiments, a silicon dioxide layer, as shown in FIG. 4. Still, the layer 50 could include alumina, hafnium dioxide, tantalum pent-oxide, barium titanate or strontium titanate, or even, silicon nitride or silicon oxinitride. This layer also plays the role of an additional (lower) cladding layer.

In a preferred embodiment, this layer 50 resembles the first interlayer (the so-called ILD1) between the electronic FEOL and the back-end-of-line (BEOL). Moreover, the silicon dioxide layer 50 preferably has a thickness between 10 and 2000 nm and a rms surface roughness of less than 0.5 nm. This surface roughness can be achieved by a dedicated deposition process.

Preferably, the silicon dioxide layer 50 is deposited by plasma enhanced chemical vapor deposition (PECVD) and is subject to successive chemical-mechanical-polishing (CMP).

Figure 5:
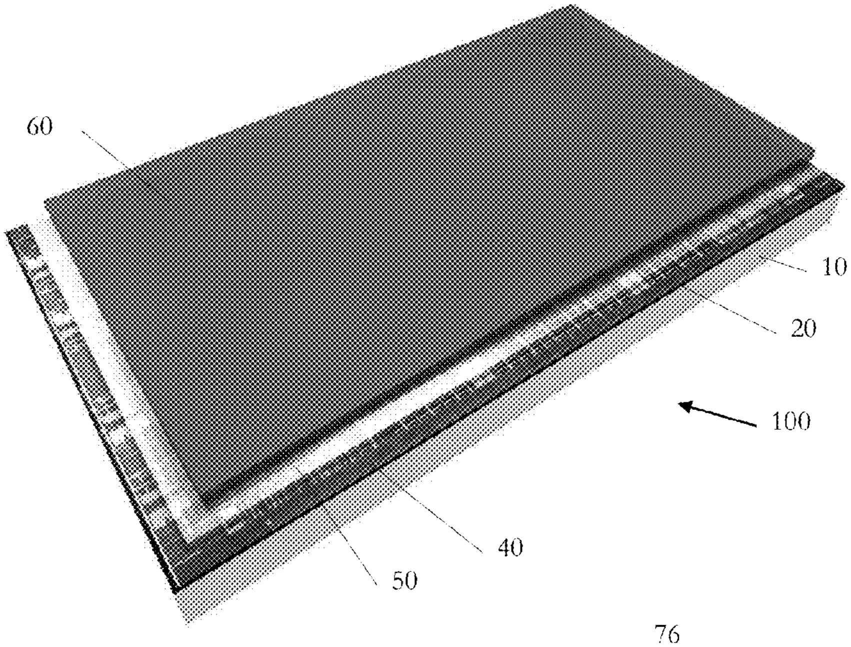

After the oxide has been deposited and planarized, the III-V layer 60 is being bonded on top of the wafer, which layer 60 is subject to further processing. The III-V wafer 60 includes the active III-V quantum well (or QW) layer or the seed layer, or both. After the bonding of the III-V layer, the III-V substrate is being removed either by grinding, wet-chemical etching or smart cut. In a preferred embodiment the III-V material is removed by a wet-chemical etchant containing HCl and water. FIG. 5 displays the current stage of the fabrication with the bonded III-V layer 60 on top. As evoked in a the previous section, the III-V layer can be a full layer stack, including a QW 624 (FIG. 15) and electrical contacts serving as lasing material. In variants, the III-V layer is a seed-layer for successive growth of III-V material on top of the wafer. It is noteworthy that the temperature budget (450 to 650° C.) is sufficient to perform the re-growth on a wafer containing electronics.

Also, the bonding can be performed on top of the ILD1 dielectric, the latter including tungsten contacts (not shown). As the tungsten contacts are small compared to the overall wafer area, the adhesion is not expected to degrade. Tungsten as a material is preferred for the contact as they are then able to serve as alignment markers for an electron beam (e-beam) process as they have a large ion mass and thus a good contrast using an electron beam imaging system.

The bonding of the III-V layer is being performed under elevated temperatures in a furnace in vacuum or in a suitable gaseous environment to establish molecular bonding. Preferably, the temperature is between 200 and 600° C. Better results shall, however, generally be obtained if the temperature is between 350 and 450° C. Suited pressures typically are below 80 kPa.

Note that the epitaxial layer stack 67 (FIG. 15) for emission is preferably made suitable for electrical pumping, to achieve the desired optical emission. In variants, it can be made suitable for optical pumping by applying a high intensity optical pulse to the active gain section 62, by way of free-space propagation. The epitaxial layer stack 67 (or simple variants thereto) can be used in the devices shown in FIGS. 6-9. In that respect, FIGS. 8-9 schematically depict devices primarily designed for electrical pumping, whereas the device shown in FIG. 7 is for optical pumping. Still, the stack of FIG. 15 can be used for electrical or optical pumping, though optical pumping does not strictly require the doped regions 628 and 642 (only required for electrical pumping). Thus, one understands that the devices FIGS. 8, 9 could be used for optical pumping too, though not optimal (FIGS. 8 and 9 have metal contacts that shield the pumping light from the top). Finally, the device of FIG. 7 can be regarded as an intermediate step towards the device of FIGS. 8, 9 (electrical pumping), or as a final structure for optical pumping.

In the next steps of the fabrication, the III-V layer 60 (including the full epitaxial layer stack 67 originating from bonding, or bonding and subsequent re-growth) is structured. The III-V layer 60 can notably be structured by either wet-chemical processing or dry-chemical processing. In preferred embodiments, the III-V is fabricated using and inductively coupled plasma (ICP) reactive ion etching (RIE) system. The fabrication of the III-V gain section obeys the alignment sought for light propagation; the gain section is aligned with respect to the silicon waveguide or the adiabatic taper sections. This can be achieved thanks to alignment marks. The alignment marks can for instance be made from silicon in the top silicon layer during the structuring of the FEOL. In variants, the alignment marker are made from tungsten and fabricated during the transistor via processing.

In embodiments, the structure 100 can be fabricated such as to be suitable for optical pumping. An example of such a device is shown in FIGS. 6A-6B. The III-V gain section extends over layer 50, in which the waveguide portions are immersed; it still has adiabatic coupling sections 75, 76 on either ends thereof. As such, it is suitable for optical pumping. It can be designed such as to have low reflectivity and loss coupling towards the waveguide portions 71, 72 (preferably silicon waveguides). Obviously, the device shown in FIGS. 6A-6B is not necessarily "final", inasmuch as additional components (e.g., dielectric layers and contacts) can need to be provided on the same wafer die.

In the embodiments of FIGS. 7-9, the III-V section 62-66 is structured relative to the silicon waveguides 71, 72 or adiabatic coupling sections 75, 76 (as before) and, in addition, exhibit a bottom contact layer 64. The latter is preferably made from a highly n-doped indium phosphide (InP) as this material exhibits an optical loss that is one order of magnitude below that of p-doped InP (e.g., 10 times lower). It can, however, include indium-gallium-arsenide (InGaAs) or indium-aluminum-arsenide (InAlAs).

As evoked earlier, FIG. 7 can be regarded as an intermediate step of fabrication of a device suitable for electrical pumping, where the III-V gain layer is structured. In the depicted image, the III-V gain section 62-64 has adiabatic coupling sections 75, 76 on either end. Such a structure forms a basis of a device that will be suitable for electrical pumping; the bottom contact section 64 will later be subject to metallization. Again, the depicted design of gain section has low reflectivity and loss coupling towards the silicon waveguides 71, 72.

After the structuring of the III-V gain layers is completed, metal contacts will be applied as shown in FIG. 8. The purpose of the contacts 65, 66 is to enable electrical pumping of the gain section. The electrical contacts 65, 66 can be made from tungsten, titanium, titanium nitride, cobalt silicide, nickel silicide, poly silicon, gold, titanium, nickel, platinum, aluminum, copper or a combination thereof. The contacts are preferably made from tungsten, for the reasons given earlier.

Additional variants are discussed now. Instead of bonding a III-V material on top of the electronics front-end 40, germanium can also be contemplated, as the later also exhibits optical gain (or is transparent in the mid-infrared). A germanium-on-Insulator (GOI) or a germanium on silicon wafer (via SiGe buffer) can be bonded on top of the ILD1 in analogy to the fabrication method described above. Also, in analogy to the substrate removal in FIG. 2, the wafer can be removed either by chemomechanical polishing, grinding, dry etching, wet-chemically or smart-cut. The silicon dioxide layer (which essentially is the buried oxide (BOX) of the wafer) can be removed either dry chemically or wet-chemically. Alternatively, the silicon dioxide layer can also remain on the germanium serving as dielectric or hard mask for further metallization steps.

Contrary to the depicted drawings, the grating couplers can also be arranged on one side of the waveguides such that they are in one row and have a certain pitch (e.g., 250 micrometers). This way, commercial fiber arrays can be used for measurement instead of single fibers. Also, instead of two fiber alignments only a single fiber alignment is required, which significantly speed up the measurement process. Then, in total, two electrical contacts (which can be established with a single electrical probe, step S20, FIG. 9) and one fiber array is required to measure the gain of, e.g., a laser structure on the chip 100.

The wavelength-dependent gain in the present invention can easily be calculated by a single measurement on a single device with a given length L and a reflector of reflectivity R from the equation as given in the paper by Ma et al., Optics Express Vol. 21, No. 8, pp. 10335-10341, 2013.

$$G(\lambda) = \frac{1}{L}\ln\frac{(1-R)P_1(\lambda) - P_2(\lambda)}{RP_2(\lambda)},$$

where $P_1$ and $P_2$ are the optical power levels measured at the additional couplers 81 and 82, respectively, and ∟ is the actual wavelength.

The methods and devices described above can be used in the fabrication of photonic chips. The resulting photonic chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip can then be integrated with other chips, discrete circuit elements, and/or other signal processing devices as part of either (a) an intermediate product, such as a motherboard, or (b) an end product. The end product can be any product that includes photonic chips, e.g., transceivers, integrated lasers, optical amplifiers, transmitters, receivers, active optical cables, etc.

While the present invention has been described with reference to a limited number of embodiments, variants and the accompanying drawings, it will be understood by those skilled in the art that various changes can be made and equivalents can be substituted without departing from the scope of the present invention. In particular, a feature (device-like or method-like) recited in a given embodiment, variant or shown in a drawing can be combined with or replace another feature in another embodiment, variant or drawing, without departing from the scope of the present invention. Various combinations of the features described in respect of any of the above embodiments or variants can accordingly be contemplated, that remain within the scope of the appended claims. In addition, many minor modifications can be made to adapt a particular situation or material to the teachings of the present invention without departing from its scope. Therefore, it is intended that the present invention not be limited to the particular embodiments disclosed, but that the present invention will include all embodiments falling within the scope of the appended claims. In addition, many other variants than explicitly touched above can be contemplated. For example, other materials than those explicitly touched (Si, $SiO_2$, $Al_2O_3$, polymers, etc.) can be contemplated. Also, other designs can be contemplated for the active gain section, the waveguide shapes, taper shapes, etc.

The invention claimed is:

1. A photonic circuit device for optical gain measurement, comprising:
- a substrate with a photonic circuit, the latter comprising one or more waveguides defining two waveguide portions aligned along a same direction;
- an active gain section, on top of the substrate and coupled in the device for generating light by electrical pumping or optical pumping;
- at least two light couplers arranged such that at least a part of the active gain section is between the light couplers, and configured for coupling light between the active gain section and the waveguide portions; and
- at least one partial reflector arranged in the waveguide portions so as to reflect light propagating along the same direction back to a center of the gain section, wherein the device does not comprise any other reflector opposite to the at least one partial reflector with respect to the active gain section and configured to reflect light back to the center of the gain section.

2. The device according to claim 1, wherein the light couplers are longitudinally extending along the same direction.

3. The device according to claim 1, wherein the light couplers each comprise at least one tapered portion, and the tapered portion terminating a waveguide portion or being connected to the active gain section, and wherein the tapered portions each have parabolic shapes.

4. The device according to claim 3, wherein the light couplers each comprise two tapered portions, which are oppositely oriented and overlapping, wherein a first one of the two tapered portions terminates a respective waveguide portion and a second one of the two tapered portions connects to the active gain section.

5. The device according to claim 1, wherein each of the waveguide portions comprises an additional light coupler, the partial reflector being between one of the light couplers and such an additional light coupler, wherein each additional light coupler is located at an end of each of the waveguide portions that is opposite to the other end of each of the waveguide portions that is the closest to the light couplers.

6. The device according to claim 1, wherein the additional light couplers are grating couplers, configured for enabling vertical measurement of light emitted at said additional light couplers.

7. The device according to claim 1, wherein the photonic circuit is a silicon photonic circuit and wherein the substrate further comprises an electrical circuit in addition to the photonic circuit.

8. The device according to claim 1, wherein the waveguide portions each extend directly on a dielectric layer of the device, and wherein the dielectric layer is on top of the substrate and has a thickness of more than 1 micron.

9. The device according to claim 8, wherein each of the one or more waveguides is in contact with a bonding layer, is partly embedded in the bonding layer, and has one surface level with a surface of the bonding layer, and where the bonding layer is one of: a polymer; SiO2; or Al2O3 or any combination thereof.

10. The device according to claim 1, wherein the gain section comprises one or more of: a III-V semiconductor material, a II-VI semiconductor material, a semiconductor such as germanium, semiconductor alloys such as silicon germanium, a polymer, a material comprising embedded quantum dots and/or quantum dashes or a quantum well material, and wherein the gain section is a III-V semiconductor material gain section comprising:
- a bottom contact layer, comprising a first metal contact; and
- an upper part, on top of the bottom contact layer, and comprising a second metal contact.

11. The device according to claim 10, wherein the gain section comprises an epitaxial layer stack, the latter including a n-doped semiconductor, at least part of which forms at least part of the bottom contact, and wherein the epitaxial layer stack further comprises an upper stack, forming at least part of the upper part of the III-V semiconductor material gain section, and which itself comprises:
- a first intrinsic semiconductor on top of the n-doped semiconductor;
- a multiple quantum well section on top of said first intrinsic semiconductor;
- a second intrinsic semiconductor on top of the multiple quantum well section; and
- a p-doped semiconductor on top of the second intrinsic semiconductor.

12. The device according to claim 1:
- wherein the photonic circuit comprises two waveguides, each defining one of the waveguide portions, and the light couplers are configured for enabling coupling of light between the active gain section and each of the two waveguides, wherein each of the two light couplers comprises two tapered portions which are oppositely oriented and overlapping, and wherein a first one of the two tapered portions forms an end of one of the waveguide portions and a second one of the two tapered portions is connected to the active gain section and forms a part thereof.

13. The device according to claim 1, wherein the photonic circuit comprises only one waveguide that defines the two waveguide portions, the waveguide having a varying cross-section, the latter having a middle portion that has a reduced width compared to outer portions of the waveguide, which outer portions define the two waveguide portions.

14. A method of optical gain measurement, comprising:

providing a photonic circuit device that includes:

a substrate with a photonic circuit, the latter comprising one or move waveguides defining two waveguide portions aligned along a same direction;

an active gain section on top of the substrate and coupled in the device for generating light by electrical pumping or optical pumping;

at least two light couplers arranged such that at least a part of the active gain section is between the light couplers, and configured for coupling light between the active gain section and the waveguide portions; and at least one partial reflector arranged in the waveguide portions so as to reflect light propagating along the same direction back to a center of the gain section, and wherein the device does not comprise any other reflector opposite to the at least one partial reflector with respect to the active gain section and configured to reflect light back to the center of the gain section, wherein the two waveguide portions comprises a first waveguide portion and a second waveguide portion;

exciting the gain section to generate light therein, by electrical pumping or optical pumping;

letting generated light transfer to each of the two waveguide portions, thanks to the light couplers, the light being partly reflected at the partial reflector; and sensing both the optical power of light emitted from the first waveguide portion and the optical power of light emitted from the second waveguide portion to evaluate the optical gain of the active gain section, wherein sensing is performed such that the light emitted from the first waveguide portion comprises:

both light generated and directly transferred to the first waveguide portion;

light generated, reflected at the partial reflector and then transferred to the first waveguide portion; and the light emitted from the second waveguide portion comprises light that was not reflected at the partial reflector.

15. The method according to claim 14, wherein each of the waveguide portions of the device provided comprises:

an additional light coupler, the partial reflector being between one of the light couplers and such an additional light coupler, wherein each additional light coupler is located at an end of each of the waveguide portions that is opposite to the other end of the each of the waveguide portions that is the closest to the light couplers; and the optical power of light emitted is sensed at each of the additional light couplers to evaluate the optical gain of the active gain section and wherein sensing the optical power is performed via optical fibers or photodetectors located in the vicinity of each of the additional light couplers.

* * * * *